United States Patent [19]

Nelson et al.

[11] Patent Number: 4,981,814

[45] Date of Patent: Jan. 1, 1991

[54] PREPARATION OF SEMICONDUCTOR DEVICES

[75] Inventors: Andrew Nelson, Felixstowe; Simon Cole, Martlesham Heath; Michael J. Harlow; Stanley Y. K. Wong, both of Ipswich, all of England

[73] Assignee: British Telecommunications Public Limited Company, London, England

[21] Appl. No.: 393,102

[22] Filed: Aug. 3, 1989

Related U.S. Application Data

[63] Continuation of Ser. No. 36,722, Apr. 10, 1987, abandoned.

[30] Foreign Application Priority Data

Apr. 15, 1986 [GB] United Kingdom ............... 8609190

[51] Int. Cl.$^5$ .................. H01L 21/20; H01L 21/324
[52] U.S. Cl. ........................ 437/81; 148/DIG. 15; 148/DIG. 119; 437/85; 437/933; 437/247; 437/939; 437/945
[58] Field of Search .............. 437/87, 96, 85, 95, 437/107, 24, 104, 126, 127, 129, 133, 949, 81, 247, 939, 945; 156/610–615; 148/DIG. 7, 15, 3, 24, 41, 65, 66, 79, 119, 169; 428/622, 642; 427/252; 372/50; 355/16, 17, 30

[56] References Cited

U.S. PATENT DOCUMENTS

| | | | |
|---|---|---|---|
| 4,116,733 | 9/1978 | Olsen et al. | 437/129 |
| 4,238,252 | 12/1980 | Kamath et al. | 437/85 |
| 4,263,064 | 4/1981 | Clawson et al. | 437/133 |
| 4,266,986 | 5/1981 | Benton et al. | 437/949 |
| 4,422,888 | 12/1983 | Stutius | 437/81 |
| 4,436,769 | 3/1984 | Moss et al. | 427/252 |
| 4,468,850 | 9/1984 | Liau et al. | 437/104 |
| 4,482,423 | 11/1984 | Besomi et al. | 156/622 |
| 4,484,332 | 11/1984 | Hawrylo | 372/50 |
| 4,509,997 | 4/1985 | Cockayne et al. | 437/133 |
| 4,540,450 | 9/1985 | Hawrylo | 437/107 |
| 4,544,417 | 10/1985 | Clarke et al. | 437/949 |
| 4,566,171 | 1/1986 | Nelson et al. | 437/133 |
| 4,608,586 | 8/1986 | Kim | 357/16 |
| 4,610,731 | 9/1986 | Chevallier et al. | 437/24 |
| 4,659,401 | 4/1987 | Reif et al. | 148/DIG. 169 |

FOREIGN PATENT DOCUMENTS

| | | | |
|---|---|---|---|
| 0197182 | 11/1984 | Japan | 437/129 |
| 0197185 | 11/1984 | Japan | 437/129 |

OTHER PUBLICATIONS

Applied Physics Letters, vol. 47, No. 8, Oct. 1985, pp. 855–857, Woodbury, N.Y., U.S.; C. P. Kuo et al.: "GaInAs/InP Guantum Wells Grown by Organometallic Vapor Phase Epitaxy".

Proceedings of the IEEE, Cornell Conference on Advanced Concepts in High Speed Semiconductor Devices and Circuits, Jul. 29th–31st, 1985, Ithala, pp. 111–119, IEEE, New York, U.S.; L. D. Zhu et al.: "Ultrahigh Mobility InP and In0.53Ga0.47As Grown by Metal-Organic Chemical Vapor Deposition for High Speed Device Applications".

Applied Physics Letters, vol. 44, No. 5, Mar. 1st, 1984, pp. 550–552, N.Y., U.S.; C. P. Kuo et al.: "Organometallic Vapor Phase Epitaxial Growth of High Purity GaInAs using Trimethylindium".

Electronics Letters, vol. 17, No. 3, Feb. 5th, 1981, pp. 113–115, London, GB; J. P. Hirtz et al., "Low Threshold GaInAsP/InP Lasers with Good Temperature Dependence Grown by low Pressure MOVPE".

Journal of the Electrochemical Society, vol. 130, No. 5, May 1983, pp. 1191–1195, Manchester, N.H., U.S.; J. S. Whitely, et al.; "Growth and Characterization of Ga0.47In0.53As film on InP substrates using triethylgallium, Triethylindium and arsine".

Primary Examiner—Olik Chaudhuri
Assistant Examiner—William Bunch
Attorney, Agent, or Firm—Nixon & Vanderhye

[57] ABSTRACT

It has been found that layers which include arsenic and/or zinc can have an adverse effect upon optoelectronic semiconductor devices such as lasers. This is reduced by treatments in which arsenic and zinc are excluded. Preferably the substrate is cooled from reaction temperature in the presence of a mixture of hydrogen and $PH_3$ (replacing $AsH_3$ and/or $Zn(CH_3)_2$ used to grow the final layer). Alternatively, devices have a contact layer of heavily p-type gallium indium arsenide are improved by the deposition of a protective layer of indium phosphide. This layer is removed immediately before metalization. Even though the protective layer is not present in the final product it has a beneficial effect.

12 Claims, No Drawings

PREPARATION OF SEMICONDUCTOR DEVICES

This is a continuation of application Ser. No. 07/036,722, filed Apr. 10, 1987, now abandoned.

This invention relates to the preparation of semiconductor devices and particularly to the preparation of devices based on indium phosphide by growing a succession of layers onto a substrate, especially by vapour phase processes such as metal organic vapour phase epitaxy.

The use of semiconductor devices based on indium phosphide has become well established during recent years. This is particularly true of optoelectronic devices such as lasers This invention is concerned with devices in which indium Phosphide is an important chemical component. In many devices the indium phosphide is an important component of every layer. Other chemical components of the devices include gallium arsenide and dopants, e.g. zinc, sulphur and cadmium (either as the element or a compound).

During the preparation of laser devices based on indium phosphide, it is often desired to grow a contact layer onto a confining layer which interfaces with the active layer. On its other side the active layer interfaces with a second confining layer which also interfaces with a second contact layer. In the use of the device the lasing action occurs in the active layer. The two confining layers together with the active layer form a waveguide structure so that the radiation travels in the active layer.

One confining layer usually consists of p-form indium phosphide doped with zinc or cadmium at a level of $10^{17}$ to $10^{18}$ atoms per cm$^3$. The adjacent contact layer usually consists of heavily p-type gallium indium arsenide doped with zinc at a level of $10^{19}$ atoms per cm$^3$. In the final device the contact layers are metal coated, e.g. with gold, tungsten or titanium. It has been noticed that the products sometimes have unsatisfactory properties and it is believed that these are associated with the contact layer.

This invention is particularly concerned with processes in which the final layer is an "adverse layer", i.e. one containing one or both of zinc and arsenic either as the element or a compound The term "adverse layer" is used because the deposition of these layers as the final step in an MOVPE process, most surprisingly, affects the properties of other layers within the product, e.g. the deposition of the adverse layer appears to cause an unacceptable increase in the ohmic resistance of the final product. The commonest forms of adverse layers include zinc-doped layers and layers which contain arsenic, e.g. GaInAs layers. The production of these layers usually involves the use of $AsH_3$ and/or $Zn(CH_3)_2$.

It will be appreciated that the growing of a contact layer is usually the final stage of MOVPE (because its function requires that the contact layer be external). Difficulties arise when the contact layer is an adverse layer as defined above and it is a particular object of this invention to reduce these difficulties.

It has now, most surprisingly, been discovered that the undesirable effects of the deposition of an adverse layer are substantially diminished by subsequent processing in the absence of As and Zn compounds, e.g. by a treatment carried out in the presence of an inert gas, e.g. hydrogen, preferably containing $PH_3$.

The invention also includes depositing a protective layer, e.g. an InP layer, onto the adverse layer. The protective layer is removed at a later stage, e.g. by chemical etching. (It is convenient to remove the protective layer immediately before metal coating).

According to one embodiment of this invention, the preparation of an optoelectronic device includes the steps of growing, in unbroken sequence, at least two layers, namely a contact layer, e.g. heavily p-type gallium indium arsenide, followed by a protective layer, e.g. p-type indium phosphide, and at a later stage removing the protective layer, e.g. by chemical etching.

It is usually convenient to grow at least three layers in unbroken sequence, namely a confining layer, a contact layer and the protective layer The confining layer may be of p-type indium phosphide doped with zinc or cadmium at a level of $10^{17}$ to $10^{18}$ atoms per cm$^3$. All the layers of the device may be grown in unbroken sequence.

The structure (without the protective layer) is a conventional device which is prepared by conventional methods, e.g. MOVPE.

After the protective layer has been removed a metallic coating, e.g. gold, tungsten or titanium, may be applied to the newly exposed surface to provide means for attaching electrical leads.

The protective layer, which is preferably of p-type indium phosphide with zinc or cadmium at a level of about $10^{18}$ atoms per cm$^3$, is chemically similar to layers conventional in this art and it is grown by conventional methods, e.g. MOVPE.

Two specific embodiments will now be described by way of example. A comparative test will also be described.

The starting material (for all three preparations) took the form of a substrate which was a partially formed device having an exposed active structure; this could have a shaped surface as in a distributed feedback laser. The substrate was placed into a reaction chamber and the air was purged with inert gas, i.e. hydrogen. First the confining layer was grown using suitable reactants, i.e. $In(CH_3)$, $PH_3$ and $Zn(CH_3)_2$ and/or $Cd(CH_3)_2$. When this layer had grown the reactants were changed at reaction temperature and without interrupting the flow of hydrogen to $In(CH_3)_3$; $Ga(CH_3)_3$; $AsH_3$ and $An(CH_3)_2$. grew the contact layer.

The completion of the contact layer marked the end of the procedure common to all three sequences (i.e. two according to the invention and one comparison). This common part was carried out using conventional metal organic vapour phase epitaxy.

After the contact layer had grown the three procedures diverged Examples 1 and 2 describe further treatments in accordance with the invention.

EXAMPLE 1

The mixture used to grow the contact layer was changed at reaction temperature into hydrogen with 5% by volume of $PH_3$. The substrate was allowed to cool to room temperature in the presence of this mixture and tested as described below.

EXAMPLE 2

The reactants were changed at reaction temperature and without interrupting the flow of hydrogen into $In(CH)_3$ and $PH_3$ and a protective layer, 100nm thick, of InP was grown by conventional MOVPE. The metal organic compound was then removed from the gas stream and the substrate was then allowed to cool to room temperature in the presence of $PH_3$ and hydrogen. In a final product the protective layer is etched off before metal coating. After the protective layer had been removed the product was tested as described below.

COMPARATIVE SEQUENCE

When the contact layer was complete, the metal organics were removed from the gas flow and the substrate $AsH_3$ and hydrogen. The product was tested as described below.

TESTS

The number of active sites (holes) per $cm^3$ were measured using a conventional technique known as electrochemical profile plotting.

The products obtained in Examples 1 and 2 gave results in the range $(1 \text{ to } 2) \times 10^{18}$ whereas the comparative preparation gave only $2 \times 10^{17}$. Thus the further treatment according to the invention gave active site concentrations, and therefore conductivities, 5 to 10 times higher than the conventional technique of cooling in the presence of $AsH_3$ and $Zn(CH_3)_2$. (Note. The higher values, i.e. the products of the invention, correspond to expectations based on doping calibration experiments).

Further experiments have confirmed the adverse effect produced when substrates are heated in the presence of zinc and/or arsenic without further corrective treatment. Thus the conductivity, i.e. the number of holes, falls if a finished substrate is heated at about 600° C. to 700° C. in an atmosphere which contains $AsH_3$ and/or $Zn(CH_3)_2$. It has also been observed that, where a substrate has been adversely affected, the effect is reversed by re-heating the substrate to about 600° C. to 700° C. and cooling to room temperature in the presence of hydrogen or a mixture of $H_2$ and $PH_3$ which contains 5% of the $PH_3$.

It is well understood that phosphide layers tend to decompose at elevated temperatures, e.g. about 500° and especially above 600° C. It is common practice to ensure the presence of $PH_3$ whenever such layers are exposed to temperatures at which decomposition constitutes an unacceptable risk. Although it may also have been common practice to cool an As-containing outer "adverse" layer in the presence of an As-containing reagent (e.g., $AsH_3$), the invention here avoids such conventional practice in cases where minor changes in As composition of the layer are acceptable (Example 1) and/or protects the As-containing layer with a further temporary layer during the cooling step (Example 2). Either way the possible adverse effects of the final or outer "adverse layer" are avoided.

We claim:
1. A method of preparing a semiconductor device based on indium phosphide, which method comprises:
   (i) growing an arsenic containing layer onto a substrate by metal organic vapour phase epitaxy;
   (ii) growing a protective layer of indium phosphide in contact with said arsenic containing layer;
   (iii) removing the protective layer whereby the arsenic containing layer is exposed; and
   (iv) metalizing the surface of the arsenic containing layer to provide electrical contact.
2. A method according to claim 1 wherein the protective layer is grown by metal organic vapour phase epitaxy using reactants which include a volatile organic compound of indium and a volatile phosphorus compound.
3. A method according to claim 1, which also comprises splitting said semiconductor device into a plurality of smaller devices; removing the protective layer from each of said smaller devices and metalizing said smaller devices to provide electrical contact.
4. A method of preparing a semiconductor device which method comprises:
   (i) growing by metal organic vapor phase epitaxy a layer which contains indium, phosphorus and arsenic;
   (II) changing, at reaction temperature, the reactants used to grow said layer into a mixture which contains inert gas and $PH_3$ and no arsenic constituents;
   (iii) cooling the device from reaction temperature to room temperature in the presence of said mixture; and
   (iv) metalizing the surface of said layer to provide electrical contact.
5. A method of preparing a semiconductor device which method comprises:
   (i) growing by metal organic vapor phase epitaxy a layer which contains indium, phosphorus and arsenic using a reaction mixture which contains inert gas, $PH_3$ and $AsH_3$;
   (ii) changing, at reaction temperatures, the reactants used to grow said layer into a binary mixture which consists of inert gas and $PH_3$;
   (iii) cooling the device from reaction temperature to room temperature in the presence of said binary mixture of inert gas and $PH_3$; and
   (iv) metalizing the surface of said layer to provide electrical contact.
6. A method according to claim 4 or 5 wherein the reactants used to grow the said layer include:
   (a) trimethyl indium or a reaction equivalent thereof;
   (b) trimethyl gallium or a reaction equivalent thereof;
   (c) a volatile arsenic compound capable of reacting with (a) and (b).
7. A method according to claim 6, wherein the reactants also include $PH_3$ and/or precursors of dopants.
8. A method according to claim 7, wherein the precursors include zinc dimethyl.
9. A method according to claim 4 or 5 wherein the cooling is carried out in the presence of a mixture of $H_2$ and $PH_3$.
10. A method according to claim 5 wherein the cooling is applied immediately after the growth of the layer which contains arsenic by changing, at reaction temperature, the reactants used to grow the said layer into the mixture used for cooling.
11. A method for preparing a semiconductor device having arsenic in a final outermost MOCVD layer, said method comprising the steps of:
   (i) growing said final layer containing arsenic onto to a substrate by MOCVD at elevated reaction temperature;
   (ii) growing by MOCVD a protective layer onto to said final layer;
   (iii) cooling said substrate with said final layer and said protective layer intact while avoiding exposure of said final layer to arsenic; and
   (iv) subsequently removing the entirety of said protective layer.
12. A method of preparing a semiconductor device which method comprises:

(i) growing by metal organic vapor phase epitaxy a layer which contains arsenic;
(ii) changing, at reaction temperature, the reactants used to grow said layer into a mixture which contains inert gas and no arsenic constituents;
(iii) cooling the device from reaction temperature to room temperature in the presence of said mixture; and
(iv) metalizing the surface of said layer to provide electrical contact.

* * * * *